(12) United States Patent
Tsao et al.

(10) Patent No.: US 10,915,158 B2
(45) Date of Patent: Feb. 9, 2021

(54) CONTROL SYSTEM AND CONTROL METHOD FOR DDR SDRAM SYSTEM WITH SHARED POWER DOMAIN

(71) Applicant: Huawei Technologies Co., Ltd., Shenzhen (CN)

(72) Inventors: Youming Tsao, Taipei (TW); Cong Yao, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 112 days.

(21) Appl. No.: 16/116,352

(22) Filed: Aug. 29, 2018

(65) Prior Publication Data

US 2018/0364791 A1 Dec. 20, 2018

Related U.S. Application Data

(63) Continuation of application No. PCT/CN2017/075117, filed on Feb. 28, 2017.

(30) Foreign Application Priority Data

Feb. 29, 2016 (CN) .......................... 2016 1 0113635

(51) Int. Cl.
*G06F 1/00* (2006.01)
*G06F 1/3234* (2019.01)
(Continued)

(52) U.S. Cl.
CPC .............. *G06F 1/3275* (2013.01); *G06F 1/08* (2013.01); *G06F 1/32* (2013.01); *G06F 1/324* (2013.01);
(Continued)

(58) Field of Classification Search
CPC . G06F 1/08; G06F 1/32; G06F 1/3206; G06F 1/3225; G06F 1/324; G06F 1/3275;
(Continued)

(56) References Cited

U.S. PATENT DOCUMENTS 6,334,167 B1 * 12/2001 Gerchman ............ G11C 11/406
365/222
2010/0007770 A1 1/2010 Koganezawa et al.
(Continued)

FOREIGN PATENT DOCUMENTS

| CN | 102169357 A | 8/2011 |
| CN | 103295622 A | 9/2013 |

(Continued)

OTHER PUBLICATIONS

Machine Translation and Abstract of Chinese Publication No. CN102169357, Aug. 31, 2011, 24 pages.
(Continued)

*Primary Examiner* — Nitin C Patel
(74) *Attorney, Agent, or Firm* — Conley Rose, P.C.

(57) ABSTRACT

The present disclosure provides a control system and a control method for a double data rate synchronous dynamic random access memory (DDR) system in order to reduce power consumption of the DDR system. The system includes a memory and a processor coupled to the memory, and the processor is configured to monitor a working status of each functional system that shares a power domain with the DDR system, determine a target power parameter value and a target clock parameter value of the DDR system according to the working status of each functional system, and control a power parameter and a clock parameter of the DDR system according to the target power parameter value and the target clock parameter value of the DDR system.

20 Claims, 4 Drawing Sheets

(51) Int. Cl.
| | |
|---|---|
| *G06F 1/324* | (2019.01) |
| *G06F 1/32* | (2019.01) |
| *G06F 1/3225* | (2019.01) |
| *G11C 11/4074* | (2006.01) |
| *G11C 7/10* | (2006.01) |
| *G06F 1/3206* | (2019.01) |
| *G06F 1/3296* | (2019.01) |
| *G06F 1/08* | (2006.01) |
| *G06F 11/30* | (2006.01) |

(52) U.S. Cl.
CPC .......... *G06F 1/3206* (2013.01); *G06F 1/3225* (2013.01); *G06F 1/3296* (2013.01); *G06F 11/3037* (2013.01); *G11C 7/1066* (2013.01); *G11C 11/4074* (2013.01)

(58) Field of Classification Search
CPC .. G06F 1/3296; G06F 11/3037; G11C 11/406; G11C 11/4074; G11C 2207/2227; G11C 2211/4067; G11C 7/1084
See application file for complete search history.

(56) References Cited

U.S. PATENT DOCUMENTS

| | | | |
|---|---|---|---|
| 2010/0138684 A1 | 6/2010 | Kim et al. | |
| 2011/0080202 A1* | 4/2011 | Moore | G06F 1/3203 327/276 |
| 2011/0264934 A1* | 10/2011 | Branover | G06F 1/3203 713/320 |
| 2012/0095607 A1* | 4/2012 | Wells | G06F 1/3203 700/291 |
| 2014/0129766 A1* | 5/2014 | Govindaraman | G06F 13/1668 711/105 |
| 2015/0124539 A1* | 5/2015 | Iijima | G11C 11/4096 365/193 |
| 2017/0148502 A1* | 5/2017 | Ikarashi | G06F 13/1636 |
| 2017/0199542 A1* | 7/2017 | Sylvester | G06F 13/16 |

FOREIGN PATENT DOCUMENTS

| | | |
|---|---|---|
| CN | 103632708 A | 3/2014 |
| CN | 104484030 A | 4/2015 |
| WO | 2015197633 A1 | 12/2015 |

OTHER PUBLICATIONS

Machine Translation and Abstract of Chinese Publication No. CN103295622, Sep. 11, 2013, 9 pages.
Machine Translation and Abstract of Chinese Publication No. CN103632708, Mar. 12, 2014, 19 pages.
Machine Translation and Abstract of Chinese Publication No. CN104484030, Apr. 1, 2015, 6 pages.
Foreign Communication From a Counterpart Application, PCT Application No. PCT/CN2017/075117, English Translation of International Search Report dated Jun. 2, 2017, 2 pages.
Foreign Communication From a Counterpart Application, PCT Application No. PCT/CN2017/075117, English Translation of Written Opinion dated Jun. 2, 2017, 7 pages.
Foreign Communication From a Counterpart Application, European Application No. 17759213.6, Extended European Search Report dated Jan. 3, 2019, 10 pages.

* cited by examiner

CONTROL SYSTEM AND CONTROL METHOD FOR DDR SDRAM SYSTEM WITH SHARED POWER DOMAIN

CROSS-REFERENCE TO RELATED APPLICATIONS

This application is a continuation of International Patent Application No. PCT/CN2017/075117 filed on Feb. 28, 2017, which claims priority to Chinese Patent Application No. 201610113635.1 filed on Feb. 29, 2016. The disclosures of the aforementioned applications are hereby incorporated by reference in their entireties.

TECHNICAL FIELD

The present disclosure relates to the field of computer technologies, and in particular, to a control system and a control method for a double data rate synchronous dynamic random access memory (DDR) system.

BACKGROUND

As computer technologies develop, a DDR system is disposed in many current communications devices. Usually, some functional systems in the devices such as an Internet service provider (ISP) system and a display system share a same power domain with the DDR system.

In other approaches, when multiple functional systems share a same power domain with the DDR system, a power voltage and a clock frequency of the DDR system are usually set to fixed values that can meet requirements of all functional modules. In this case, although normal working of each functional system can be ensured, a power consumption problem is caused to the DDR system.

SUMMARY

Embodiments of the present disclosure provide a control system and a control method for a DDR system in order to reduce power consumption of the DDR system.

An embodiment of the present disclosure provides a control system for a DDR system, including a monitoring unit and a control unit.

The monitoring unit monitors a working status of each functional system that shares a power domain with the DDR system, and determines a target power parameter value and a target clock parameter value of the DDR system according to the detected working status, of each functional system.

The control unit controls a power parameter and a clock parameter of the DDR system according to the target power parameter value and the target clock parameter value of the DDR system that are determined by the monitoring unit.

The power parameter may be a power voltage, and the clock parameter may be a clock frequency.

That is, the monitoring unit may further determine a target power voltage value and a target clock frequency value of the DDR system according to the working status, obtained by means of monitoring, of each functional system.

The control unit may further control a power voltage and a clock frequency of the DDR system according to the target power voltage value and the target clock frequency value of the DDR system that are determined by the monitoring unit.

Further, the monitoring unit may determine a required clock frequency value of each functional system according to the working status, obtained by means of monitoring, of each functional system, and then determine the target power voltage value and the target clock frequency value of the DDR system according to the required clock frequency value of each functional system.

In a specific embodiment of the present disclosure, the monitoring unit may determine a maximum value in the required clock frequency values of all the functional systems as the target clock frequency value of the DDR system, and then determine the target power voltage value of the DDR system according to the target clock frequency value of the DDR system.

Further, in this embodiment of the present disclosure, in a process in which the control unit controls the power parameter and the clock parameter of the DDR system to change, the DDR system is in a self-refresh state. In this case, the control system for the DDR system further includes a delay buffer unit. The delay buffer unit is used as a data storage buffer of each functional system when the DDR system is in a self-refresh state.

Before controlling the power parameter and the clock parameter of the DDR system to change, the control unit may determine that a data volume of the delay buffer unit reaches a preset data volume.

After controlling the power parameter and the clock parameter of the DDR system to change, the control unit may control, according to the changed power parameter or the changed clock parameter, the DDR system to enter a corresponding working mode.

An embodiment of the present disclosure further provides a control method for a DDR system, including monitoring a working status of each functional system that shares a power domain with the DDR system, determining a target power parameter value and a target clock parameter value of the DDR system according to the working status of each functional system, and controlling a power parameter and a clock parameter of the DDR system according to the target power parameter value and the target clock parameter value of the DDR system.

The power parameter may be a power voltage, and the clock parameter may be a clock frequency.

That is, determining a target power parameter value and a target clock parameter value of the DDR system according to the working status of each functional system may further include determining a target power voltage value and a target clock frequency value of the DDR system according to the working status of each functional system.

The controlling a power parameter and a clock parameter of the DDR system according to the target power parameter value and the target clock parameter value of the DDR system may further include controlling a power voltage and a clock frequency of the DDR system according to the target power voltage value and the target clock frequency value of the DDR system.

Further, determining a target power voltage value and a target clock frequency value of the DDR system according to the working status of each functional system may include determining a required clock frequency value of each functional system according to the working status of each functional system, and determining the target power voltage value and the target clock frequency value of the DDR system according to the required clock frequency value of each functional system.

In a specific embodiment of the present disclosure, determining the target power voltage value and the target clock frequency value of the DDR system according to the required clock frequency value of each functional system may further include determining a maximum value in the required clock frequency values of all the functional systems as the target clock frequency value of the DDR system, and determining the target power voltage value of the DDR system according to the target clock frequency value of the DDR system.

Further, in this embodiment of the present disclosure, in a process of controlling the power parameter and the clock parameter of the DDR system to change, the DDR system is in a self-refresh state. Before controlling the power parameter and the clock parameter of the DDR system to change, the method further includes determining that a data volume of a delay buffer unit reaches a preset data volume, where the delay buffer unit is used as a data storage buffer of each functional system when the DDR system is in a self-refresh state.

After controlling the power parameter and the clock parameter of the DDR system to change, the DDR system may further be controlled according to the changed power parameter or the changed clock parameter to enter a corresponding working mode.

According to the control system and the control method for a DDR system that are provided in the embodiments of the present disclosure, a power parameter and a clock parameter of the DDR system are controlled according to a working status of each functional system that shares a power domain with the DDR system. That is, the power parameter and the clock parameter of the DDR system are related to the working status of each functional system. Therefore, not only normal working of each functional system can be ensured, but also power consumption of the DDR system is reduced.

BRIEF DESCRIPTION OF DRAWINGS

The drawings are provided to further understand the present disclosure, and they constitute a part of the application. The drawings, along with the embodiments of the present disclosure, are used to explain the present disclosure, and pose no limitation on the present disclosure.

DESCRIPTION OF EMBODIMENTS

To provide an implementation solution for reducing power consumption of a DDR system, embodiments of the present disclosure provide a control system and a control method for a DDR system. The following describes embodiments of the present disclosure with reference to the accompanying drawings of the specification. It should be understood that, the preferred embodiments described herein are merely used to describe and explain the present disclosure, but are not intended to limit the present disclosure. In addition, the embodiments in this application and features in the embodiments may be mutually combined provided that no conflict is caused.

Figure 1:
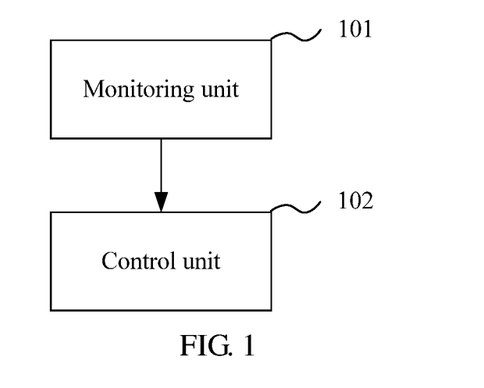
FIG. 1 is a schematic structural diagram 1 of a control system for a DDR system according to an embodiment of the present disclosure.

An embodiment of the present disclosure provides a control system for a DDR system. As shown in FIG. 1, the control system may include the following units.

A monitoring unit 101 is configured to monitor a working status of each functional system that shares a power domain with the DDR system, and determine a target power parameter value and a target clock parameter value of the DDR system according to the detected working status of each functional system. The working status of the functional system may include but is not limited to a load status, an operating scenario, and the like of the functional system.

A control unit 102 is configured to control a power parameter and a clock parameter of the DDR system according to the target power parameter value and the target clock parameter value of the DDR system that are determined by the monitoring unit 101.

Generally, the power parameter and the clock parameter of the DDR system are in a one-to-one correspondence. Therefore, when the target power parameter value of the DDR system is the same as a current power parameter value of the DDR system, the target clock parameter value of the DDR system is also the same as a current clock parameter value of the DDR system. When the target power parameter value of the DDR system is different from the current power parameter value of the DDR system, the target clock parameter value of the DDR system is also different from the current clock parameter value of the DDR system.

Therefore, during actual implementation, the control unit 102 may first determine whether the target power parameter value of the DDR system is different from the current power parameter value of the DDR system. When the target power parameter value of the DDR system is the same as the current power parameter value of the DDR system, the control unit 102 does not output a parameter adjustment instruction. In this case, the power parameter and the clock parameter of the DDR system remain unchanged. When the target power parameter value of the DDR system is different from the current power parameter value of the DDR system, the control unit 102 outputs a parameter adjustment instruction, controls the power parameter of the DDR system to change to the target power parameter value, and controls the clock parameter of the DDR system to change to the target clock parameter value.

That is, according to the control system for a DDR system provided in this embodiment of the present disclosure, the power parameter and the clock parameter of the DDR system are related to the working status of each functional system, and are no longer fixed values. In this way, not only normal working of each functional system can be ensured, but also power consumption of the DDR system can be reduced.

In this embodiment of the present disclosure, the power parameter may be a power voltage, and the clock parameter may be a clock frequency.

In this case, the monitoring unit 101 determines a target power voltage value and a target clock frequency value of the DDR system according to the detected working status of each functional system. The control unit 102 controls a power voltage and a clock frequency of the DDR system according to the target power voltage value and the target clock frequency value of the DDR system that are determined by the monitoring unit 101.

Further, the monitoring unit 101 may first determine a required clock frequency value of each functional system according to the detected working status of each functional system, and then determine the target power voltage value and the target clock frequency value of the DDR system according to the required clock frequency value of each functional system. The target power voltage value and the target clock frequency value of the DDR system that are determined according to the required clock frequency value of each functional system can ensure normal working of each functional system.

In a specific embodiment of the present disclosure, the monitoring unit 101 may determine a maximum value in the required clock frequency values of all the functional systems as the target clock frequency value of the DDR system, and then determine the target power voltage value of the DDR system according to the target clock frequency value of the DDR system.

It should be noted that the foregoing specific embodiment is merely an example. The method used by the monitoring unit 101 to determine the target power voltage value and the target clock frequency value of the DDR system is simple and direct, and is of relatively high efficiency and easy to implement.

In another specific embodiment of the present disclosure, the monitoring unit 101 may determine the target power voltage value and the target clock frequency value of the DDR system according to the required clock frequency value of each functional system in another manner. The power parameter and the clock parameter of each functional system are also in a one-to-one correspondence. Therefore, in a specific embodiment of the present disclosure, the monitoring unit 101 may determine a required power voltage value of each functional system according to the required clock frequency value of each functional system, then determine a maximum value in the required power voltage values of all the functional systems as the target power voltage value of the DDR system, and then determine the target clock frequency value of the DDR system according to the target power voltage value of the DDR system. Certainly, as described in the foregoing specific embodiment, a maximum value in the required clock frequency values of all the functional systems may be directly determined as the target clock frequency value of the DDR system.

Certainly, the monitoring unit 101 may determine the target power voltage value and the target clock frequency value of the DDR system according to the required clock frequency value of each functional system in another manner, and details are not described herein using an example.

In this embodiment of the present disclosure, in a process in which the control unit 102 controls the power parameter and the clock parameter of the DDR system to change, the DDR system is in a self-refresh state.

Figure 2:
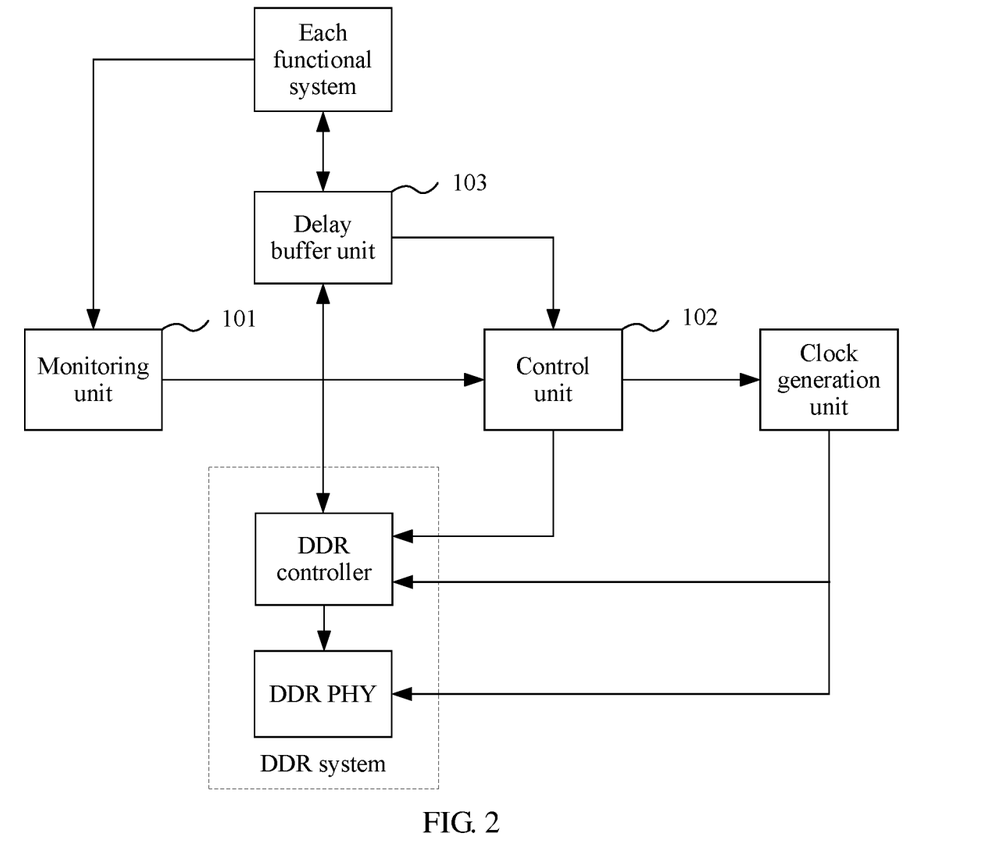
FIG. 2 is a schematic structural diagram 2 of a control system for a DDR system according to an embodiment of the present disclosure.

Therefore, during actual implementation, in addition to the monitoring unit 101 and the control unit 102, as shown in FIG. 2, the control system may further include a delay buffer unit 103, used as a data storage buffer of each functional system when the DDR system is in a self-refresh state.

Before controlling the power parameter and the clock parameter of the DDR system to change, the control unit 102 may further determine that a data volume of the delay buffer unit 103 reaches a preset data volume.

In the process in which the power parameter and the clock parameter of the DDR system change, when the DDR system is in a self-refresh state, each functional system cannot read data from the DDR system any more, and can read data only from the delay buffer unit 103. If the data volume of the delay buffer unit 103 is extremely small and data cannot be sent to the functional system in time, an exception is caused.

Therefore, before controlling the power parameter and the clock parameter of the DDR system to change, the control unit 102 determines that the data volume of the delay buffer unit 103 is not less than a required data volume of each functional system in the process in which the power parameter and the clock parameter of the DDR system change, that is, determines that the data volume of the delay buffer unit 103 reaches the preset data volume such that an exception can be avoided.

Figure 3:
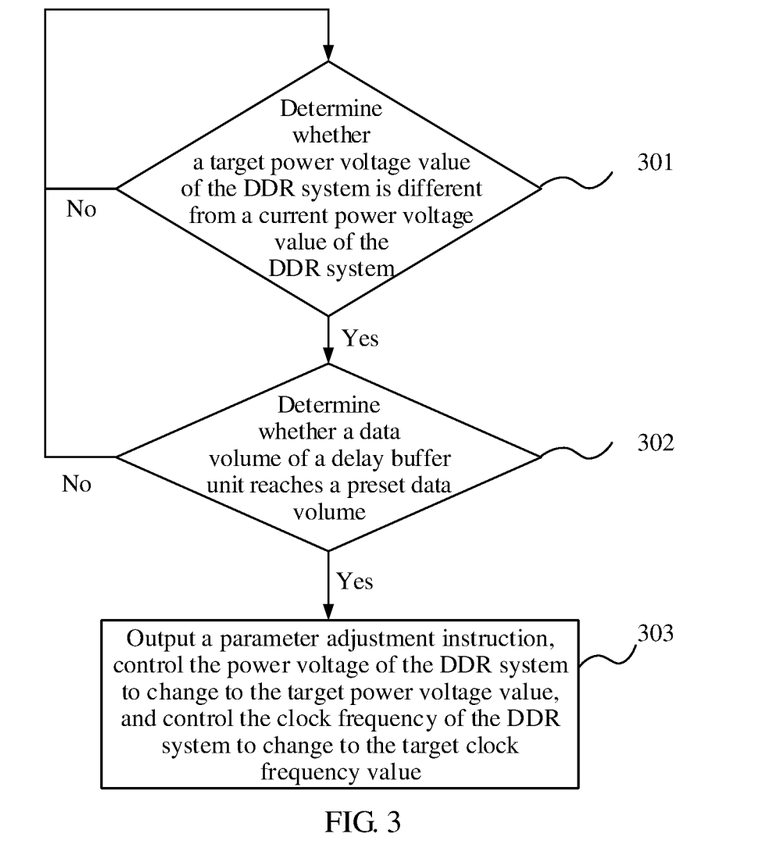
FIG. 3 is a flowchart diagram of a procedure performed by a control unit in a control system for a DDR system according to an embodiment of the present disclosure.

That is, when the power parameter is a power voltage, and the clock parameter is a clock frequency, as shown in FIG. 3, the control unit 102 may perform the following steps when controlling the power voltage and the clock frequency of the DDR system according to the target power voltage value and the target clock frequency value of the DDR system that are determined by the monitoring unit 101.

Step 301: Determine whether the target power voltage value of the DDR system is different from a current power voltage value of the DDR system.

When the target power voltage value of the DDR system is different from the current power voltage value of the DDR system, step 302 is performed.

When the target power voltage value of the DDR system is the same as the current power voltage value of the DDR system, step 301 is performed repeatedly.

Step 302: Determine whether a data volume of the delay buffer unit reaches a preset data volume.

When the data volume of the delay buffer unit reaches the preset data volume, step 303 is performed.

When the data volume of the delay buffer unit does not reach the preset data volume, step 301 is performed again.

Step 303: Output a parameter adjustment instruction, control the power voltage of the DDR system to change to the target power voltage value, and control the clock frequency of the DDR system to change to the target clock frequency value.

As shown in FIG. 2, the DDR system includes a DDR controller and a DDR physical layer (PHY). The parameter adjustment instruction output by the control unit 102 may be input to the DDR controller in the DDR system. After receiving the parameter adjustment instruction, the DDR controller controls the DDR PHY to enter a self-refresh state, that is, enables the DDR system to be in a self-refresh state.

When the power parameter is a power voltage, after controlling the DDR PHY to enter a self-refresh state, the DDR controller may change the power voltage of the DDR system.

When the clock parameter is a clock frequency, the parameter adjustment instruction output by the control unit 102 further needs to be input to a clock generation unit. The clock generation unit generates a corresponding clock frequency according to the target clock frequency value, and inputs the clock frequency to the DDR controller and the DDR PHY in the DDR system in order to change the clock frequency of the DDR system.

After controlling the power parameter of the DDR system to change to the target power parameter value, and the clock parameter of the DDR system to change to the target clock parameter value, the control unit 102 may further control, according to the changed power parameter or the changed clock parameter, that is, the target power parameter value or the target clock parameter value, the DDR system to enter a corresponding working mode. Because in different working modes, specific quantities of circuits that are switched on at the DDR PHY in the DDR system are different, power consumption of the DDR system also varies. Therefore, the power consumption of the DDR system can further be reduced by controlling, according to the changed power parameter or the changed clock parameter, the DDR system to enter the corresponding working mode. Then the DDR controller may control the DDR PHY to exit a self-refresh state, that is, enable the DDR system to exit a self-refresh state, and restore to a normal working state.

During actual implementation, working mode indication information may be carried in the parameter adjustment instruction, and may be sent to the DDR controller by the control unit 102.

When the power parameter is a power voltage, and the clock parameter is a clock frequency, it is assumed that a working mode of the DDR system includes a low-voltage mode with low power consumption and a high-voltage mode with high power consumption. In this case, the DDR controller in the DDR system may perform a procedure in FIG. 4, which includes the following steps.

Figure 4:
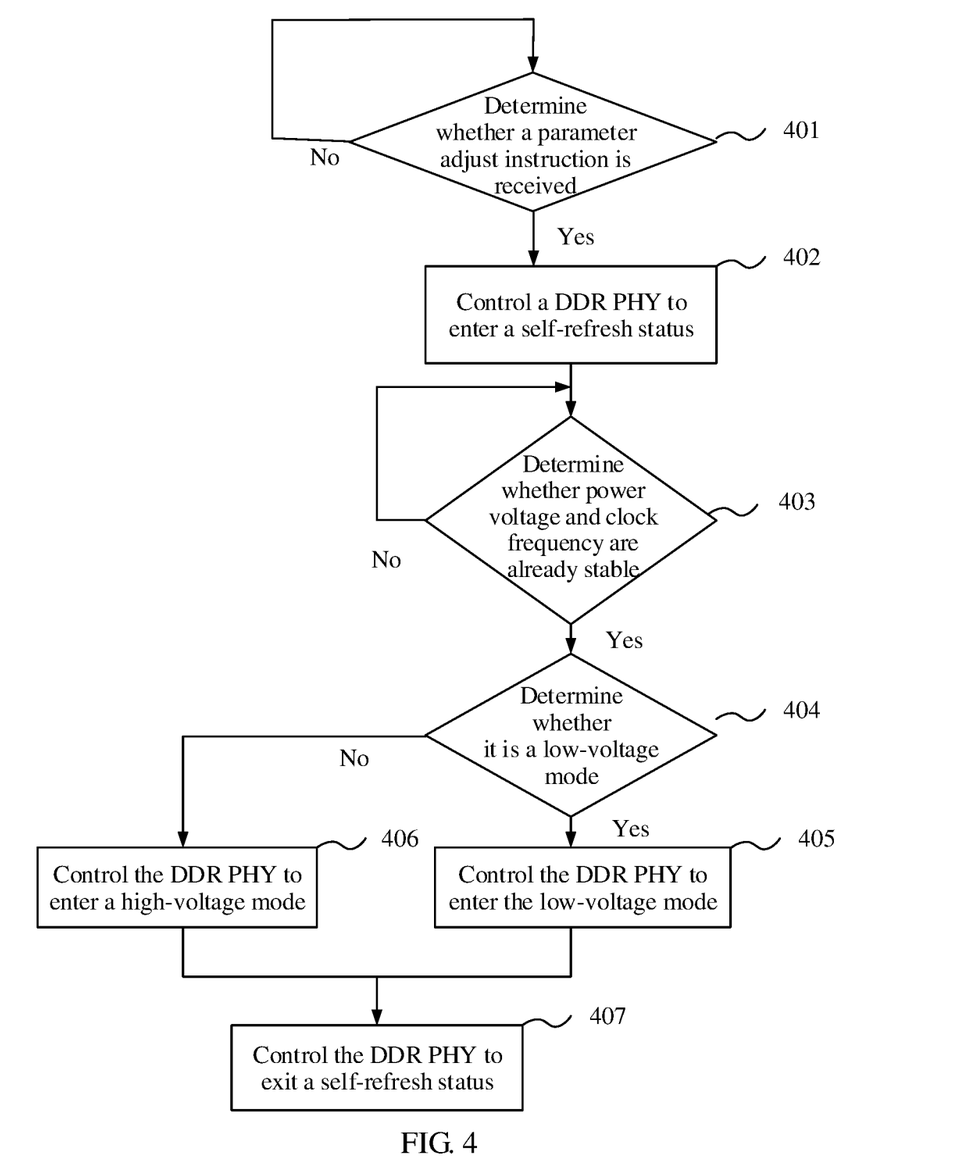
FIG. 4 is a flowchart diagram of a procedure performed by a DDR controller in a DDR system according to an embodiment of the present disclosure.

Step 401: Determine whether the parameter adjustment instruction is received.

When the parameter adjustment instruction is received, step 402 is performed.

When no parameter adjustment instruction is received, step 401 is performed repeatedly.

Step 402: Control the DDR PHY to enter a self-refresh state, and then control the power voltage of the DDR system to change.

After the DDR PHY enters a self-refresh state, the clock frequency of the DDR system also changes.

Step 403: Determine whether the power voltage and the clock frequency are already stable.

When the power voltage and the clock frequency are already stable, step 404 is performed.

When the power voltage and the clock frequency are not stable, step 403 is performed repeatedly.

Step 404: Determine whether it is a low-voltage mode.

When it is a low-voltage mode, step 405 is performed.

When it is not a low-voltage mode, step 406 is performed.

Step 405: Control the DDR PHY to enter the low-voltage mode, and then perform step 407.

Step 406: Control the DDR PHY to enter a high-voltage mode, and then perform step 407.

Step 407: Control the DDR PHY to exit a self-refresh state.

In conclusion, by means of the control system for a DDR system provided in this embodiment of the present disclosure, power consumption of the DDR system can be reduced, and a large quantity of resources can be saved.

An embodiment of the present disclosure further provides a mobile terminal, including the foregoing control system for a DDR system.

Figure 5:
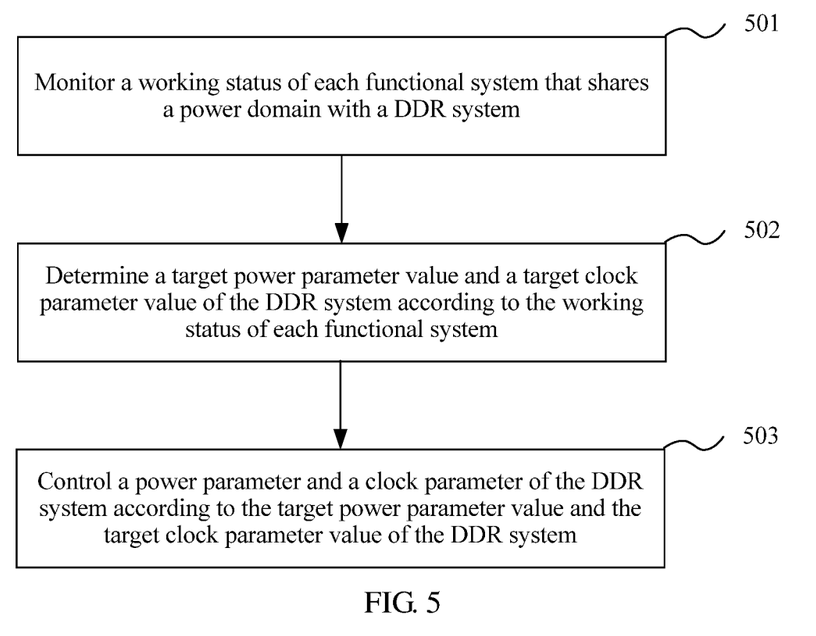
FIG. 5 is a flowchart flowchart of a control method for a DDR system according to an embodiment of the present disclosure.

Based on a same inventive concept, and according to the control system for a DDR system provided in the foregoing embodiment of the present disclosure, correspondingly, an embodiment of the present disclosure further provides a control method for a DDR system. As shown in FIG. 5, the method may include the following steps.

Step 501: Monitor a working status of each functional system that shares a power domain with the DDR system, where the working status of the functional system may include but is not limited to a load status, an operating scenario, and the like of the functional system.

Step 502: Determine a target power parameter value and a target clock parameter value of the DDR system according to the working status of each functional system.

Step 503: Control a power parameter and a clock parameter of the DDR system according to the target power parameter value and the target clock parameter value of the DDR system.

That is, according to the control method for a DDR system provided in this embodiment of the present disclosure, the power parameter and the clock parameter of the DDR system are related to the working status of each functional system, and are no longer fixed values. In this way, not only normal working of each functional system can be ensured, but also power consumption of the DDR system can be reduced.

In this embodiment of the present disclosure, the power parameter may be a power voltage, and the clock parameter may be a clock frequency.

In this case, step 502 of determining a target power parameter value and a target clock parameter value of the DDR system according to the working status of each functional system may include determining a target power voltage value and a target clock frequency value of the DDR system according to the working status of each functional system.

Step 503 of controlling a power parameter and a clock parameter of the DDR system according to the target power parameter value and the target clock parameter value of the DDR system may include controlling a power voltage and a clock frequency of the DDR system according to the target power voltage value and the target clock frequency value of the DDR system.

Further, determining a target power voltage value and a target clock frequency value of the DDR system according to the working status of each functional system may include determining a required clock frequency value of each functional system according to the working status of each functional system, and then determining the target power voltage value and the target clock frequency value of the DDR system according to the required clock frequency value of each functional system. In this way, normal working of each functional system can be ensured.

In a specific embodiment of the present disclosure, determining the target power voltage value and the target clock frequency value of the DDR system according to the required clock frequency value of each functional system may include determining a maximum value in the required clock frequency values of all the functional systems as the target clock frequency value of the DDR system, and determining the target power voltage value of the DDR system according to the target clock frequency value of the DDR system.

In another specific embodiment of the present disclosure, the target power voltage value and the target clock frequency value of the DDR system may be determined according to the required clock frequency value of each functional system in another manner, and details are not described herein using an example.

In this embodiment of the present disclosure, in a process of controlling the power parameter and the clock parameter of the DDR system to change, the DDR system is in a self-refresh state. Before controlling the power parameter and the clock parameter of the DDR system to change, the method further includes determining that a data volume of a delay buffer unit reaches a preset data volume, where the delay buffer unit is used as a data storage buffer of each functional system when the DDR system is in a self-refresh state.

After controlling the power parameter and the clock parameter of the DDR system to change, the DDR system may further be controlled, according to the changed power parameter or the changed clock parameter, to enter a corresponding working mode in order to further reduce the power consumption of the DDR system.

The foregoing steps may be corresponding to functions of corresponding units in the structures shown in FIG. 1 and FIG. 2, and details are not described herein again.

Persons skilled in the art should understand that the embodiments of the present disclosure may be provided as a method, a system, or a computer program product. Therefore, the present disclosure may use a form of hardware only embodiments, software only embodiments, or embodiments with a combination of software and hardware. Moreover, the present disclosure may use a form of a computer program product that is implemented on one or more computer-usable storage media (including but not limited to a disk memory, a compact disc read-only memory (CD-ROM), an optical memory, and the like) that include computer-usable program code.

The present disclosure is described with reference to the flowcharts and/or block diagrams of the method, the device (system), and the computer program product according to the embodiments of the present disclosure. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of any other programmable data processing device to generate a machine such that the instructions executed by a computer or a processor of any other programmable data processing device generate an apparatus for implementing a specific function in one or more processes in the flowcharts and/or in one or more blocks in the block diagrams.

These computer program instructions may also be stored in a computer readable memory that can instruct the computer or any other programmable data processing device to work in a specific manner such that the instructions stored in the computer readable memory generate an artifact that includes an instruction apparatus. The instruction apparatus implements a specific function in one or more processes in the flowcharts and/or in one or more blocks in the block diagrams.

These computer program instructions may also be loaded onto a computer or another programmable data processing device such that a series of operations and steps are performed on the computer or the other programmable device, thereby generating computer-implemented processing. Therefore, the instructions executed on the computer or the other programmable device provide steps for implementing a specified function in one or more processes in the flowcharts and/or in one or more blocks in the block diagrams.

Although some embodiments of the present disclosure have been described, persons skilled in the art can make changes and modifications to these embodiments once they learn the basic inventive concept. Therefore, the following claims are intended to be construed as to cover some embodiments and all changes and modifications falling within the scope of the present disclosure.

Obviously, persons skilled in the art can make various modifications and variations to the embodiments of the present disclosure without departing from the spirit and scope of the embodiments of the present disclosure. The present disclosure is intended to cover these modifications and variations provided that they fall within the scope of protection defined by the following claims and their equivalent technologies.

What is claimed is:

1. A control system in a device for a double data rate synchronous dynamic random access memory (DDR) system, wherein the control system comprises:
a processor; and
a memory coupled to the processor and storing instructions which, when executed cause the processor to:
monitor a working status of at least two functional systems that share a power domain with the DDR system;
determine a required clock frequency value of each of the at least two functional systems according to the working status of the at least two functional systems;
determine a maximum value in the required clock frequency values of the at least two functional systems as a target clock frequency value of the DDR system;
determine a target power voltage value of the DDR system according to the target clock frequency value; and
control a power voltage and a clock frequency of the DDR system according to the target power voltage value and the target clock frequency value,
wherein the device comprises the control system, the DDR system, and the at least two functional systems, and wherein the DDR system comprises a DDR controller and a DDR physical layer (PHY) circuit.

2. The control system of claim 1, wherein in a process in which controlling the power voltage and the clock frequency of the DDR system to change, the DDR system is in a self-refresh state, and the control system further comprising a delay buffer coupled to the processor and the memory and configured to be used as a data storage buffer of the at least two functional systems when the DDR system is in the self-refresh state.

3. The control system of claim 2, wherein before controlling the power voltage and the clock frequency of the DDR system, the instructions further cause the processor to be configured to determine that a data volume of the delay buffer reaches a preset data volume.

4. The control system of claim 1, wherein after controlling the power voltage and the clock frequency of the DDR system, the instructions further cause the processor to be configured to control, according to a changed power voltage, the DDR system to enter a corresponding working mode.

5. The control system of claim 1, wherein after controlling the power voltage and the clock frequency of the DDR system, the instructions further cause the processor to be configured to control, according to a changed clock frequency, the DDR system to enter a corresponding working mode.

6. The control system of claim 1, wherein the instructions further cause the processor to be configured to determine, prior to controlling the power voltage, whether the target power voltage value of the DDR system is different from a current power voltage of the DDR system.

7. The control system of claim 1, wherein the required clock frequency values of the at least two functional systems comprises at least two different required clock frequency values.

8. A control method performed by a control system in a device for a double data rate synchronous dynamic random access memory (DDR) system, wherein the control method comprises:
monitoring a working status of at least two functional systems that shares a power domain with the DDR system;
determining a required clock frequency value of each of the at least two functional systems according to the working status of the at least two functional systems;
determining a maximum value in the required clock frequency values of the at least two functional systems as a target clock frequency value of the DDR system;
determining a target power voltage value of the DDR system according to the target clock frequency value, and
controlling a power voltage and a clock frequency of the DDR system according to the target power voltage value and the target clock frequency value,
wherein the device comprises the control system, the DDR system, and the at least two functional systems, and wherein the DDR SDRAM-system comprises a DDR controller and a DDR physical layer (PHY) circuit.

9. The control method of claim 8, wherein in a process of controlling the power voltage and the clock frequency of the DDR SDRAM-system to change, the DDR system is in a self-refresh state, before controlling the power voltage and the clock frequency of the DDR system to change, the method further comprising determining that a data volume of a delay buffer reaches a preset data volume, and the delay buffer being used as a data storage buffer of the at least two functional systems when the DDR system is in the self-refresh state.

10. The control method of claim 8, wherein after controlling the power voltage and the clock frequency of the DDR system to change, the method further comprises controlling, according to a changed power voltage the DDR system to enter a corresponding working mode.

11. The control method of claim 8, wherein after controlling the power voltage and the clock frequency of the DDR system to change, the method further comprises controlling, according to a changed clock frequency, the DDR system to enter a corresponding working mode.

12. The control method of claim 8 further comprising determining, prior to controlling the power voltage, whether the target power voltage value of the DDR system is different from a current power voltage of the DDR system.

13. The control method of claim 8, wherein the required clock frequency values of the at least two functional systems comprises at least two different required clock frequency values.

14. A computer program product embodied on a non-transitory computer readable storage medium comprising instructions which, when executed by a processor of control system in a device for a double data rate synchronous dynamic random access memory (DDR) system, cause the processor to:
monitor a working status of at least two functional systems that share a power domain with the DDR system;
determine a required clock frequency value of each of the at least two functional systems according to the working status of the at least two functional systems;
determine a maximum value in the required clock frequency values of the at least two functional systems as a target clock frequency value of the DDR system;
determine a target power voltage value of the DDR system according to the target clock frequency value; and
control a power voltage and a clock frequency of the DDR system according to the target power voltage value and the target clock frequency value, wherein the device comprises the control system, the DDR system, and the at least two functional systems, and wherein the DDR system comprises a DDR controller and a DDR physical layer (PHY) circuit.

15. The computer program product of claim 14, wherein in a process in which controlling the power voltage and the clock frequency of the DDR system to change, the DDR system is in a self-refresh state, and the control system further comprising a delay buffer coupled to the processor and the memory and configured to be used as a data storage buffer of the at least two functional systems when the DDR system is in the self-refresh state.

16. The computer program product of claim 15, wherein before controlling the power voltage and the clock frequency of the DDR system, the instructions further cause the processor to be configured to determine that a data volume of the delay buffer reaches a preset data volume.

17. The computer program product of claim 14, wherein after controlling the power voltage and the clock frequency of the DDR system, the instructions further cause the processor to be configured to control, according to a changed power voltage, the DDR system to enter a corresponding working mode.

18. The computer program product of claim 14, wherein after controlling the power voltage and the clock frequency of the DDR system, the instructions further cause the processor to be configured to control, according to a changed clock frequency, the DDR system to enter a corresponding working mode.

19. The computer program product of claim 14, wherein the instructions further cause the processor to be configured to determine, prior to controlling the power voltage, whether the target power voltage value of the DDR system is different from a current power voltage of the DDR system.

20. The computer program product of claim 14, wherein the required clock frequency values of the at least two functional systems comprises at least two different required clock frequency values.

* * * * *

UNITED STATES PATENT AND TRADEMARK OFFICE
CERTIFICATE OF CORRECTION

PATENT NO. : 10,915,158 B2
APPLICATION NO. : 16/116352
DATED : February 9, 2021
INVENTOR(S) : Youming Tsao and Cong Yao Page 1 of 1

It is certified that error appears in the above-identified patent and that said Letters Patent is hereby corrected as shown below:

In the Claims

Claim 8, Column 11, Line 26: "and wherein the DDR SDRAM-system comprises" should read "and wherein the DDR system comprises"

Claim 9, Column 11, Line 31: "DDR SDRAM-system to change," should read "DDR system to change,"

Signed and Sealed this
Thirtieth Day of March, 2021

Drew Hirshfeld
*Performing the Functions and Duties of the
Under Secretary of Commerce for Intellectual Property and
Director of the United States Patent and Trademark Office*